United States Patent
van Dongen et al.

(10) Patent No.: US 11,515,585 B2
(45) Date of Patent: Nov. 29, 2022

(54) ACCURATE BATTERY TEMPERATURE MEASUREMENT BY COMPENSATING SELF HEATING

(71) Applicant: Datang NXP Semiconductors Co., Ltd., Jiangsu (CN)

(72) Inventors: Marijn Nicolaas van Dongen, Utrecht (NL); Hendrik Boezen, Nijmegen (NL); Joop Petrus Maria van Lammeren, Beuningen (NL); Henricus Cornelis Johannes Büthker, Mierlo (NL)

(73) Assignee: Datang NXP Semiconductors Co., Ltd., Jiangsu (CN)

( * ) Notice: Subject to any disclaimer, the term of this patent is extended or adjusted under 35 U.S.C. 154(b) by 953 days.

(21) Appl. No.: 16/281,662

(22) Filed: Feb. 21, 2019

(65) Prior Publication Data
US 2020/0274207 A1    Aug. 27, 2020

(51) Int. Cl.
| | |
|---|---|
| *H01M 10/48* | (2006.01) |
| *G01R 31/3835* | (2019.01) |
| *G01K 13/00* | (2021.01) |
| *H01M 10/42* | (2006.01) |
| *H02J 7/00* | (2006.01) |

(52) U.S. Cl.
CPC .......... *H01M 10/486* (2013.01); *G01K 13/00* (2013.01); *G01R 31/3835* (2019.01); *H01M 10/425* (2013.01); *H01M 2010/4271* (2013.01); *H02J 7/0068* (2013.01)

(58) Field of Classification Search
None
See application file for complete search history.

(56) References Cited

U.S. PATENT DOCUMENTS

| | | | |
|---|---|---|---|
| 7,514,904 B2 | 4/2009 | Marchand et al. | |
| 7,609,032 B2 | 10/2009 | Laig-Hoerstebrock et al. | |
| 7,646,176 B2 | 1/2010 | Yamamoto | |
| 7,725,286 B2 | 5/2010 | Koch | |
| 2014/0015515 A1* | 1/2014 | Satou | G01R 1/203 324/126 |
| 2014/0129165 A1* | 5/2014 | Nagato | G01R 31/3835 702/63 |
| 2017/0170666 A1* | 6/2017 | Watanabe | H02J 7/0091 |

* cited by examiner

*Primary Examiner* — Jas A Sanghera
(74) *Attorney, Agent, or Firm* — Foley & Lardner LLP

(57) ABSTRACT

A method for accurately measuring a battery temperature using a temperature sensor embodied in a battery monitoring integrated circuit is disclosed. The method includes performing calibration to estimate a thermal resistance between the battery monitoring integrated circuit and a terminal of a battery, measuring a temperature using the temperature sensor, measuring a voltage at the terminal or at a supply pin of the battery monitoring integrated circuit while a current is being used to charge or discharge the battery, calculating a power by multiplying the voltage and the current, and calculating a self-heating temperature adjustment to the temperature by multiplying the power and the thermal resistance.

12 Claims, 2 Drawing Sheets

ACCURATE BATTERY TEMPERATURE MEASUREMENT BY COMPENSATING SELF HEATING

BACKGROUND

Battery banks that power machines including motor vehicles consist of a plurality of cells. Measuring voltage of each battery cell is important to balancing battery cells by providing measure amount of charging current depending on the voltage of each cells. Furthermore, battery cells are kept at an optimal temperature during their use. Therefore, monitoring cell temperature is important. Typically, negative temperature coefficient (NTC) resistors are used for measuring temperature. NTC is made of semiconductor material that provides a change in resistance with changes in temperature. However, installing an NTC on every battery cell requires additional efforts including connecting individual NTCs to a central monitoring system while there is already a connection from voltage monitoring component to the central monitoring system.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a method for accurately measuring a battery temperature using a temperature sensor embodied in a battery monitoring integrated circuit is disclosed. The method includes performing calibration to estimate a thermal resistance between the battery monitoring integrated circuit and a terminal of a battery, measuring a temperature using the temperature sensor, measuring a voltage at the terminal or at a supply pin of the battery monitoring integrated circuit while a current is being used to charge or discharge the battery, calculating a power by multiplying the voltage and the current, and calculating a self-heating temperature adjustment to the temperature by multiplying the power and the thermal resistance.

In another embodiment, a battery monitoring integrated circuit is disclosed. The battery monitoring integrated circuit includes a voltage sensor to measure a voltage at a battery terminal, a temperature sensor for measuring temperature of inside the battery monitoring integrated circuit and a processor configured to perform a method. The method includes performing calibration to estimate a thermal resistance between the battery monitoring integrated circuit and a terminal or a battery, measuring a temperature using the temperature sensor, measuring a voltage at the terminal of while a current is being used to charge the battery, calculating a power by multiplying the voltage and the current, and calculating a self-heating temperature adjustment to the temperature by multiplying the power and the thermal resistance.

In some examples, the voltage sensor is embodied on one side of the battery monitoring integrated circuit and the temperature sensor is embodied on an opposite side from the voltage sensor.

In one or more embodiments, the calibration includes mounting the battery monitoring integrated circuit on the terminal. The calibration steps also include drawing a first current ($I_1$) from the battery and measuring a first temperature (T1) using the temperature sensor and drawing a second current ($I_2$) from the battery that is different from the first current and measuring a second temperature (T2) using the temperature sensor. The calibration further includes measuring a battery voltage (Vbat) at the terminal and calculating a thermal resistance between the battery monitoring integrated circuit and the terminal.

The thermal resistance is stored in a memory either in the battery monitoring integrated circuit or in a pack controller coupled to the battery monitoring integrated circuit. The stored thermal resistance is then used to calculate a temperature offset to account for self-heating of the battery monitoring integrated circuit due to its own components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in detail in the description so as not to obfuscate the present disclosure.

The embodiments described herein includes an integrated circuit (IC) for measuring voltage and temperature of a battery cell in the pack of cells. The ICs connected to different battery cells may communicate with each other and with the pack controller via a communication link. The IC includes a communication module to effectuate communication with the pack controller. The IC may also include a controller that can be programmed to collect temperature and voltage data at preset intervals and also to execute commands received from the pack controller.

All the circuits in the IC consume a (constant) current, therefore the internal power dissipation will cause the internal temperature to be higher than the battery temperature, so an accurate measurement is not possible. The quality of the thermal coupling/thermal resistance is not known beforehand, and may be different for each cell.

The embodiments described herein are advantageous because a separate thermistor or NTC along with associated wiring is not needed to measure battery temperature. The temperature is measured by a temperature sensor embodied inside the same IC that is used for voltage measurement and communication with the battery pack controller. However, since internal components of the IC consume current and consequently dissipate heat, the temperature sensed by the temperature sensor includes rise in temperature due to self-heating of the IC. To offset the temperature generated by self-heating of the IC, during the calibration process, the thermal resistance between the IC and the battery contact is calculated and stored. The thermal resistance is then used by either the IC or the pack controller to subtract the temperature rise caused by self-heating of the IC to derive an accurate temperature at the battery terminal. Measurement of an accurate temperature may be needed to efficiently and optimally charge the battery.

Figure 1:
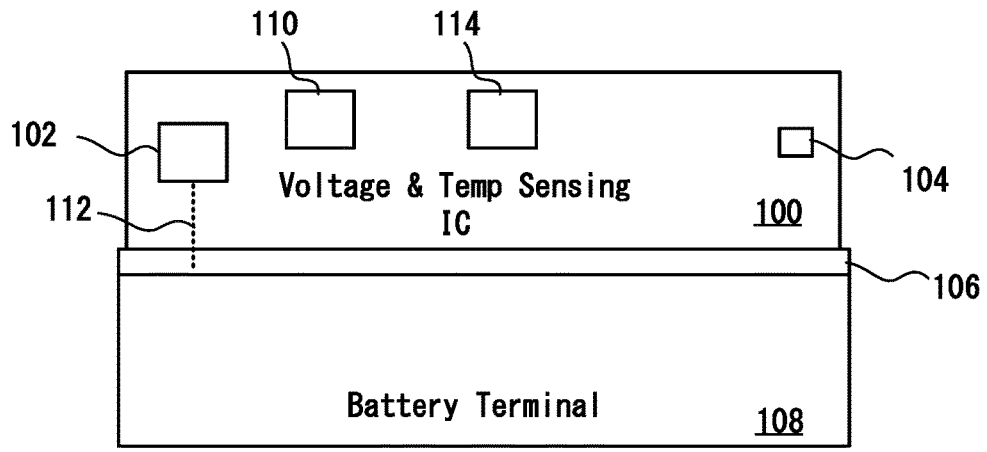
FIG. 1 shows a block diagram of a temperature and voltage monitoring chip installed on a battery terminal.

FIG. 1 shows a block diagram of an IC 100 mounted on a battery connection 108 through a metallic lead frame 106. The IC 100 includes a voltage sensor 102. The voltage sensor 102 may include an analog to digital converter that produces a digital output of a voltage drop across a resistor that is coupled to the voltage terminal. The IC 100 also includes an on-chip digital temperature sensor (DTS) 104. The DTS provides a digital output that represents ambient temperature of the IC die-pad. The temperature sensed by the DTS may also be, at least roughly within an acceptable margin of error, the temperature of at the battery terminal 108. Voltage sensor and DTS are well known in the art, therefore a detailed structural description is being omitted.

However, when the voltage sensor 102 is operational, the included components of the voltage sensor 102 and other components of the IC 100 may dissipate some heat and will cause a rise in temperature of the die-pad. The value of this temperature rise needs to be calculated, at least at calibration time of each battery cell. In some examples, even when the IC 100 is mounted in close thermal contact to the battery terminal 108, there may still be a thermal resistance up to 10 kelvin per watt. Each cell may have a different thermal resistance on the voltage sensor 102 to battery terminal 108 path as depicted by the line 112. This thermal resistance (R2) needs to be calculated for each IC mounting. The thermal resistance R2 is the temperature difference across the IC 100 and its coupling to the battery terminal 108 when a unit of heat energy flows through the coupling in unit time. It is the reciprocal of thermal conductance.

With R2 known, the output of the DTS 104 can be adjusted to compensate for self-heating that will be in proportion to R2 and the voltage measurement provided by the voltage sensor 102. The value of R2 for each IC 100 mounted on the battery terminal may be stored in the pack controller so that the pack controller may adjust temperature measurement received from the DTS 104 according to R2 and the voltage measurement.

The battery charging system includes a programmable current source 110 that can be controlled to provide cell balancing where a particular amount of current may be used (for example, for charging the battery cell) based on the voltage measurement provided by the voltage sensor 102. During the initial calculations of R2, a temperature T1 is measured by the DTS 104 at a current $I_1$ applied to the voltage sensor 102 to activate the voltage sensor 102. Another temperature T2 is measured by the DTS 104 when the current $I_2$ is applied to the voltage sensor 102. The thermal resistance R2 can then be estimated using the formula $R2=(T2-T1)/(I_2-I_1)*Vbat$, where Vbat is the supply voltage of the IC 100.

The voltage sensor 102 includes a digital to analog converter (DAC). In one example, the internal components of the IC consume approximately 10-30 milliamp current. However, the DAC may consume 150-300 milliamp. Therefore, the DAC contributes significantly more to self-heating of the IC 100. During the calibration step, in some examples, the programmable current source is used to measure the temperature using the DTS 104 at a normal current when the IC 100 is not being used for voltage measurement and at a current that loads the DAC. Prior to taking T2 current measurement, the process waits for a preselected time to allow the temperature to stabilize. In some examples, the voltage sensor 102 is embodied at one end of the die-pad (i.e., the silicon on in which the components of the IC 100 are fabricated) and the DTS 104 is fabricated on the opposite side from the voltage sensor 102.

Self-heating typically may raise the temperature measured by the DTS 104 by 2-4 kelvin. However, the temperature accuracy required in many of the battery applications in approximately 1 kelvin. The embodiments described herein will at the very least comply with the accuracy requirements of most typical applications.

To derive the temperature rise due to self-heating of the IC 100 during normal operating conditions, the power (P) is calculated by multiplying the output of the voltage sensor 102 by the current the current being supplied by the battery. This current is known through current measurements (alternatively, the supply current of the IC 100 may be designed to have a fixed value). Finally, the temperature rise due to self-heating can be derived using the formula $\Delta T=P \times R2$. This value is then subtracted from the temperature sensed by the DTS 104 to derive the temperature at the battery terminal 108.

Figure 2:
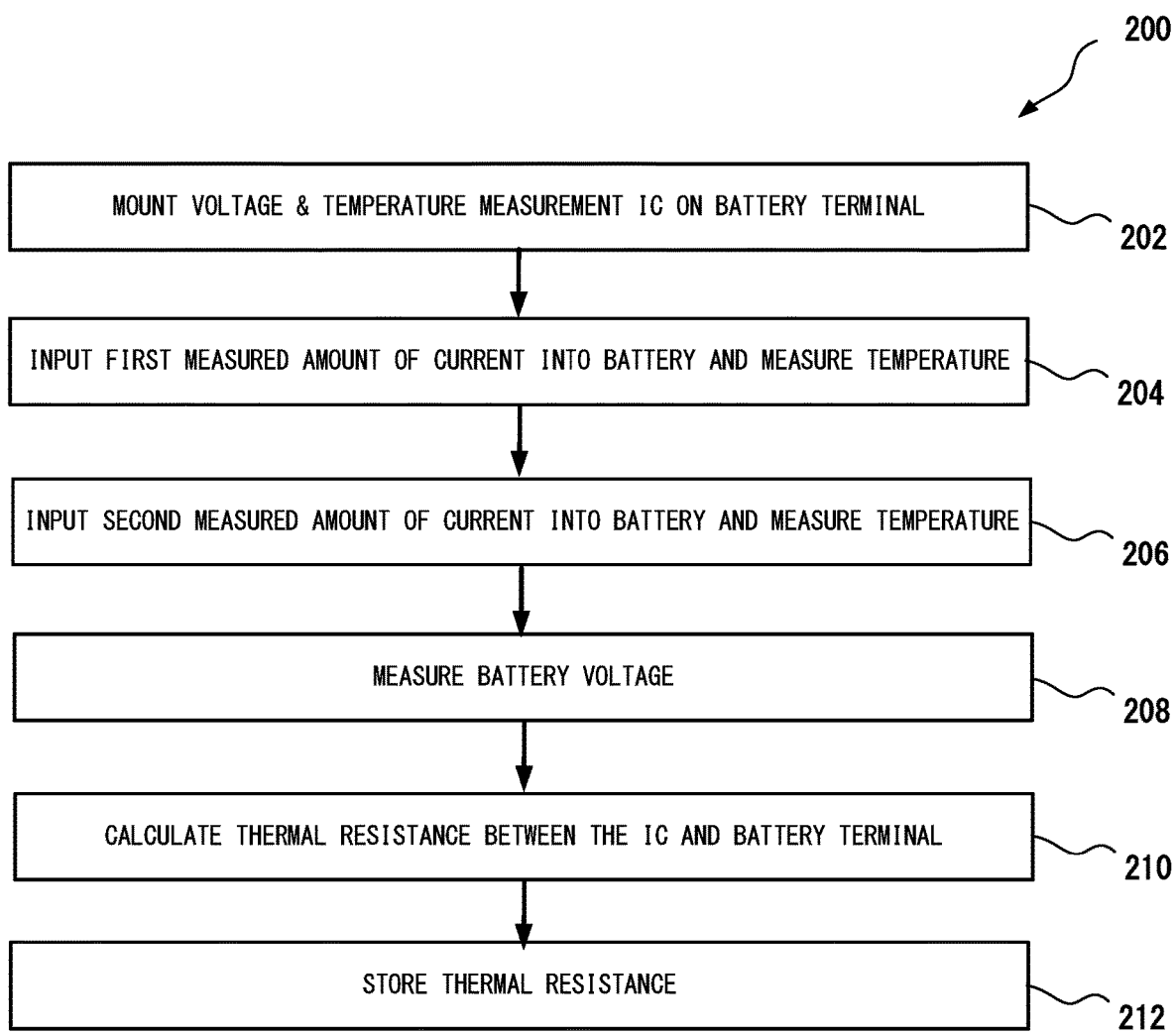
FIG. 2 shows a block diagram of a method for calibrating the temperature and voltage monitoring chip for a battery cell.

FIG. 2 shows a method 200 for calibrating the IC 100 to determine a thermal resistance between the IC 100 and the battery terminal 108. Accordingly, at step 202, the IC 102 is mounted on the battery terminal 108. At step 204, the IC 100 is activated by passing the current $I_1$ and the temperature (T1) is measured through the DTS 104. At step 206, the current $I_2$ that is different from the current $I_1$, is used and again the temperature (T2) is measured using the DTS 104. At step 208, the battery voltage (Vbat) is measured using the voltage sensor 102. At step 210, the thermal resistance R2 is estimated using the formula $R2=(T2-T1)/(I_2-I_1)*Vbat$ (the IC 100 supply voltage). At step 212, R2 is stored either in the IC 100 or in a pack controller coupled to the IC 100.

Figure 3:
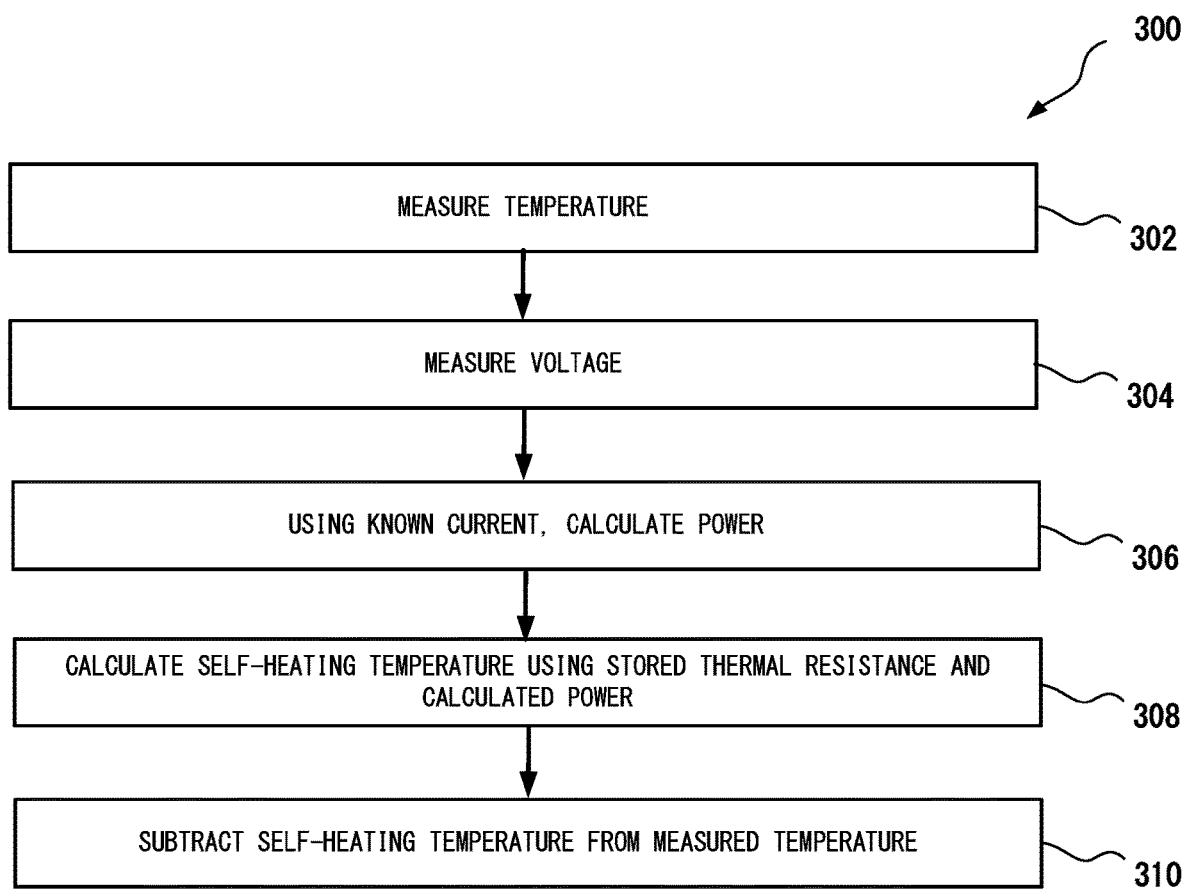
FIG. 3 shows a block diagram of a method for adjusting temperature measurement according to a thermal resistance.

FIG. 3 is a method 300 for adjusting the temperature measured by the DTS 104 accounting to the stored thermal resistance R2 for the IC 100. Accordingly, at step 302, the temperature is measured using the DTS 104. This measurement may be effectuated when a request is received from the pack controller coupled to the IC 100. In another example, the IC 100 can be programmed to measure the temperature at preselected intervals and transmit the measurement to the pack controller. At step 304, the voltage at the battery terminal 108 is measured using the voltage sensor 102. The current being used to charge the battery or the current being drawn from the battery is known as it can be measured using a current sensor. At step 306, the power is calculated by multiplying the battery voltage and the current. At step 308, the calculated power is multiplied by the thermal resistance R2 to derive self-heating contribution to the temperature measurement at step 302, and at step 310, the self-heating contribution temperature is subtracted from the temperature measured at step 302. It may be noted that in some examples, the calculations described above may be performed at the pack controller instead on in the IC 100. In some embodiments, the IC 100 may optionally include a processor 114 to perform calibration and temperature adjustment calculations as described above. In other examples, the pack controller may include a processor to perform some or all calculations described herein.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A method for accurately measuring a battery temperature using a temperature sensor embodied in a battery monitoring integrated circuit, the method comprising:

performing calibration to estimate a thermal resistance between the battery monitoring integrated circuit and a terminal of a battery;

measuring a temperature using the temperature sensor;

measuring a voltage at the terminal or at a supply pin of the battery monitoring integrated circuit while a current is being used to charge or discharge the battery;

calculating a power by multiplying the voltage and the current; and calculating a self-heating temperature adjustment to the temperature by multiplying the power and the thermal resistance.

2. The method of claim 1, wherein the performing the calibration includes mounting the battery monitoring integrated circuit on the terminal.

3. The method of claim 2, wherein the performing the calibration further includes drawing a first current ($I_1$) from the battery and measuring a first temperature (T1) using the temperature sensor.

4. The method of claim 3, wherein the performing the calibration further includes drawing a second current ($I_2$) from the battery that is different from the first current and measuring a second temperature (T2) using the temperature sensor.

5. The method of claim 4, wherein the performing the calibration further includes measuring a battery voltage (Vbat) at the terminal.

6. The method of claim 5, wherein the performing the calibration further includes calculating a thermal resistance between the battery monitoring integrated circuit and the terminal.

7. The method of claim 6, wherein the thermal resistance is calculating using a formula $R2=(T2-T1)/(I_2-I_1)*Vbat$.

8. The method of claim 6, further including storing the thermal resistance.

9. The method of claim 8, wherein the thermal resistance is stored in a pack controller coupled to the battery monitoring integrated circuit.

10. The method of claim 8, wherein the thermal resistance is stored in the battery monitoring integrated circuit.

11. A battery monitoring integrated circuit, comprising:

a voltage sensor to measure a voltage at a battery terminal;

a temperature sensor for measuring temperature of inside the battery monitoring integrated circuit; and a processor configured to perform the method as in claim 1.

12. The battery monitoring integrated circuit of claim 11, wherein the voltage sensor is embodied on one side of the battery monitoring integrated circuit and the temperature sensor is embodied on an opposite side from the voltage sensor.

* * * * *